(12) United States Patent
Kuglin

(10) Patent No.: US 6,392,404 B1
(45) Date of Patent: May 21, 2002

(54) TRIGGERED INTEGRATED CIRCUIT TESTER

(75) Inventor: Philip T. Kuglin, Tualatin, OR (US)

(73) Assignee: Credence Systems Corporation, Fremont, CA (US)

( * ) Notice: Subject to any disclaimer, the term of this patent is extended or adjusted under 35 U.S.C. 154(b) by 122 days.

(21) Appl. No.: 09/628,703

(22) Filed: Jul. 31, 2000

(51) Int. Cl.[7] .......................... G01R 31/26; G06K 5/04; G06F 11/00
(52) U.S. Cl. ..................... 324/158.1; 714/700; 714/707
(58) Field of Search .............................. 324/158.1, 765; 714/700, 699, 707, 731, 744, 738, 815

(56) References Cited

U.S. PATENT DOCUMENTS 6,073,264 A * 6/2000 Nelson et al. ................. 714/38

* cited by examiner

Primary Examiner—Vinh P. Nguyen
Assistant Examiner—Russell M. Kobert

(74) Attorney, Agent, or Firm—Daniel J. Bedell; Smith-Hill and Bedell

(57) ABSTRACT

A triggered integrated circuit (IC) tester in accordance with the invention organizes a test of an IC into a succession of test cycles. A vector generated prior to the start of each test cycle references the test activities to be carried out during the test cycle. The tester generates a set of N periodic timing signals, T0 through T(N−1), each having a period equal to the duration of one test cycle with the timing signals being distributed in phase so that their edges evenly divide each test cycle into N intervals. Each test cycle nominally starts on an edge of the T0 signal, and each vector referencing a test event also indicates a nominal time delay following the start of the test cycle at which the event is to occur by referencing one of the timing signals T0 through T(N−1). However whenever the tester receives an input trigger signal edge, it determines an offset between the most recent T0 signal edge and the occurrence of the trigger signal edge. During subsequent test cycles, the tester delays the start of test cycles and occurrence of test events by the amount of the trigger signal edge offset. In doing so, the tester makes the delay of each subsequent test event with respect to the trigger signal edge a predictable function of the vector sequence.

21 Claims, 5 Drawing Sheets

TRIGGERED INTEGRATED CIRCUIT TESTER

BACKGROUND OF THE INVENTION

1. Field of the Invention

Figure 1:
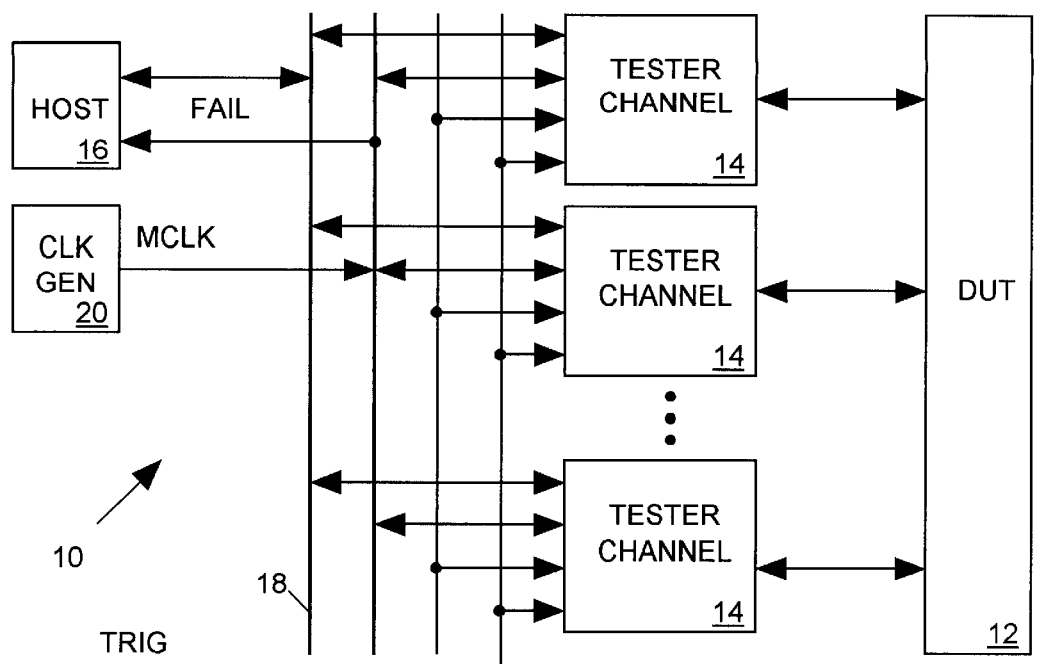

The present invention relates in general to integrated circuit (IC) testers and in particular to an IC tester that adjusts timing of test events following an asynchronous trigger signal edge so that subsequent test events occur with predictable delays following the trigger signal edge.

2. Description of Related Art

An integrated circuit (IC) tester typically organizes an IC test into a succession of test cycles. A pattern generator within the tester produces a control data word (a "vector") before the start of each test cycle referencing any test activities to be carried out during the following test cycle. Test activities may include, for example changing a state of a test signal input to an IC terminal or sampling an output signal produced at a DUT terminal. When the timing of test activities is controlled with a higher resolution than the period of one test cycle, the vector also indicates a time during the test cycle at which the tester is to initiate the referenced test activity.

The sequence of vectors that control test activities during a test may be supplied to the tester before the test either directly or in the form of an algorithmic program for generating the vector sequence. In either case, the vector sequence completely predetermines the course of the test, including the test activities to be carried out and the times during each test cycle at which each test activity is to be carried out. The start of each test cycle is controlled by a period clock signal derived from a master clock signal produced by a stable oscillator, and the vectors reference the timing of all test events to edges of the period clock signal. However it would be beneficial in some applications if a tester could time its test activities in relation to an edge of externally generated trigger signal edge which may or may not coincide with an edge of the period clock signal. For example we might want a tester to synchronize the timing of its test activities to a trigger signal produced by external instrumentation that is to carry out test activities concurrently with the tester. Or we may want a tester to re-synchronize its test activities to a trigger signal produced during a test, for example, by the IC under test itself.

Suppose, for example, we want to test an asynchronous IC that produces an output handshaking signal at one of its terminals indicating when output data is available at one or more of its terminals. Suppose also that would like a tester to be able to sample that output data with some defined delay following an edge of that handshaking signal. In a conventional tester, vectors define event timing with respect to edges of the period clock. Thus when a handshaking signal edge does not occur with a predictable delay following an edge of the period clock, we cannot program a tester to respond to the handshaking signal with a predictable delay.

What is needed is an integrated circuit tester that can adjust the timing of test events defined by a vector sequence following an asynchronous trigger signal edge so that each test event occurs with predictable delay following the trigger signal edge.

SUMMARY OF THE INVENTION

A triggered integrated circuit (IC) tester in accordance with the invention organizes a test of an IC into a succession of test cycles and a vector generated prior to the start of each test cycle references the test activities to be carried out during the test cycle. The tester generates a set of N periodic timing signals, T0 through T(N−1), each having a period equal to the duration of one test cycle with the timing signals being distributed in phase so that their edges evenly divide each test cycle into N intervals. Each test cycle nominally starts on an edge of the T0 signal, and each vector referencing a test event also indicates a time delay following the nominal start of the test cycle at which the event is to occur by referencing one of the timing signals T0 through T(N−1).

In accordance with one aspect of the invention, whenever the tester receives an input trigger signal edge, the tester determines an offset between the most recent T0 signal edge and the occurrence of the trigger signal edge. During all test cycles thereafter, the tester delays test events from the nominal time defined by the vectors by the amount of the offset. In doing so, the tester makes the delay of each subsequent test event with respect to the trigger signal edge a predictable function of the vector sequence.

It is accordingly an object of the invention to provide an integrated circuit tester that can adjust the timing of each test event defined by a vector sequence following a trigger signal edge so that subsequent test events occur with predictable delays following the trigger signal edge.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
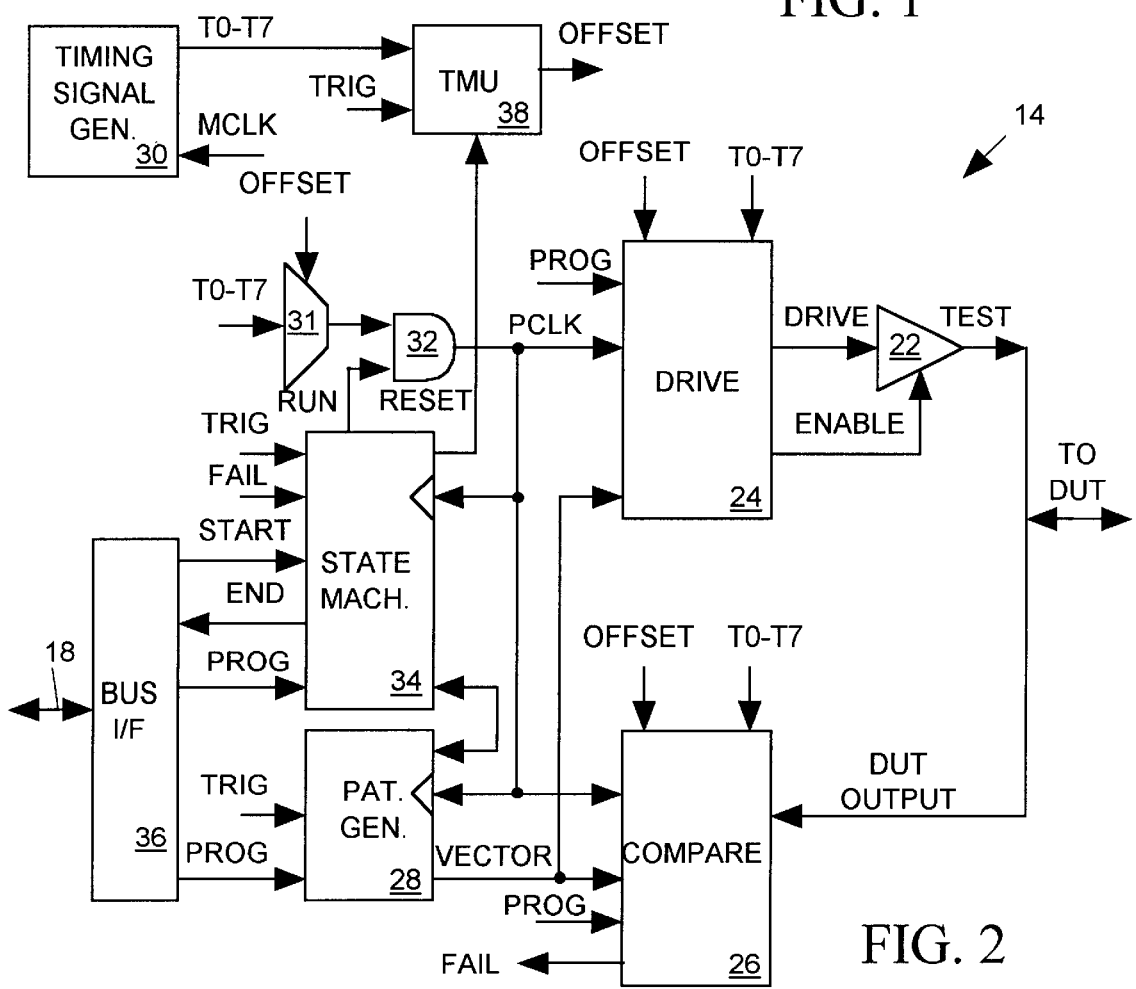
Figure 3:
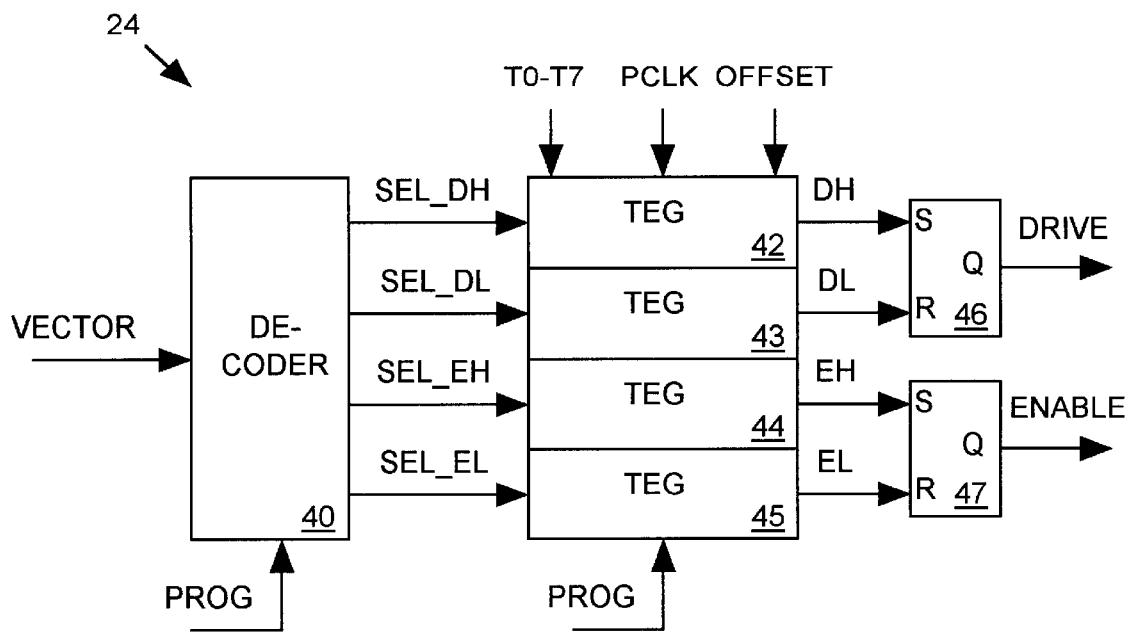
Figure 4:
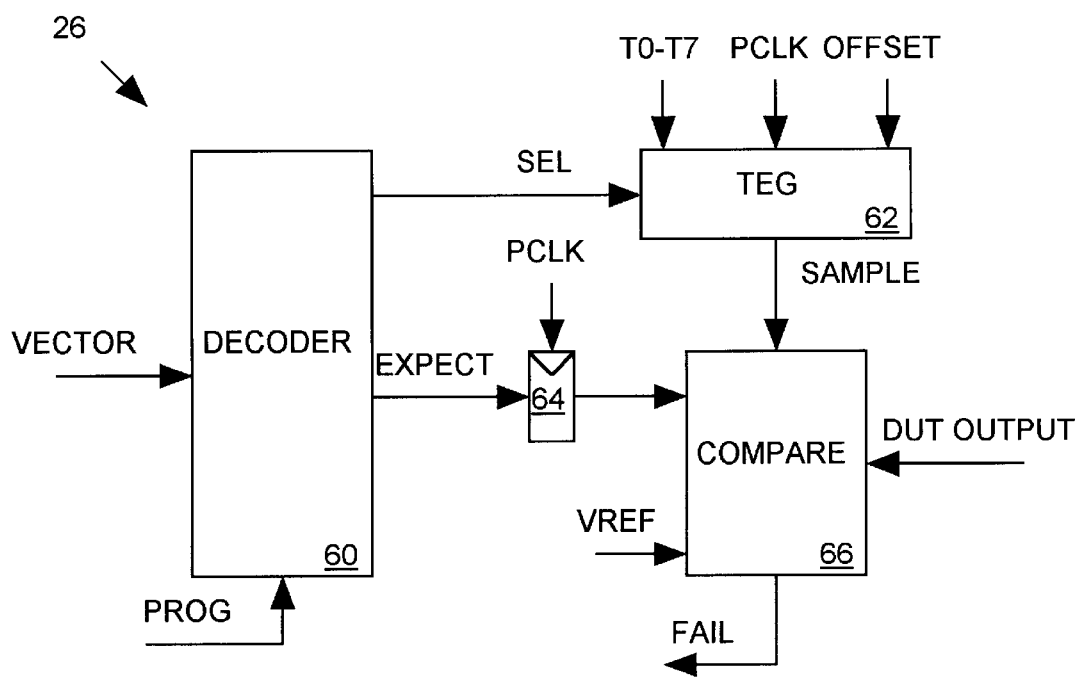
Figure 5:
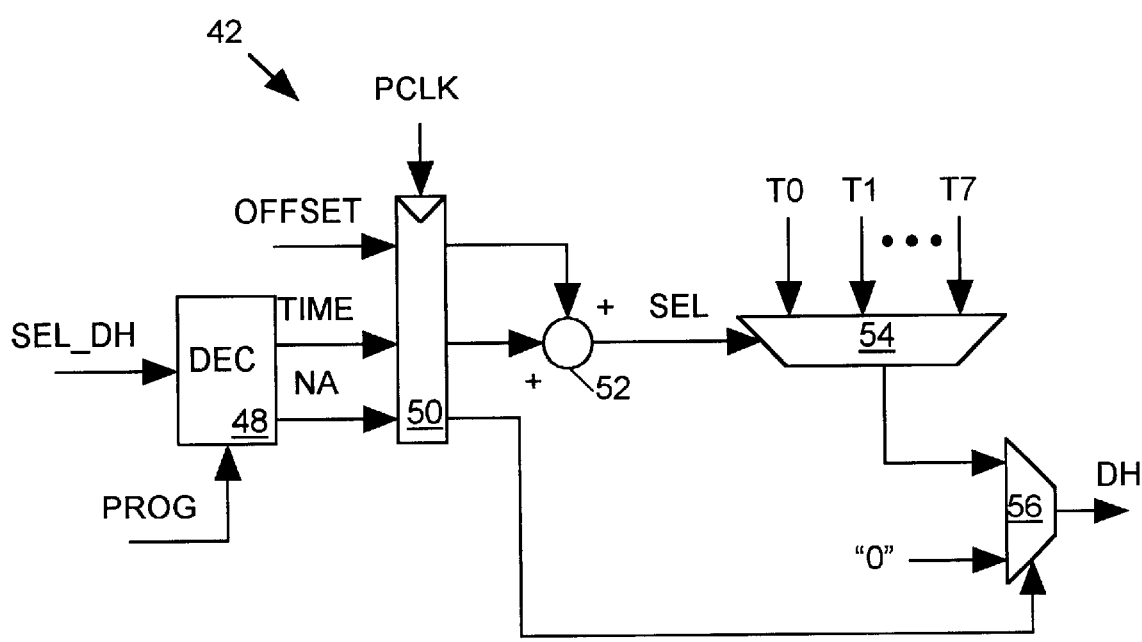
Figure 6:
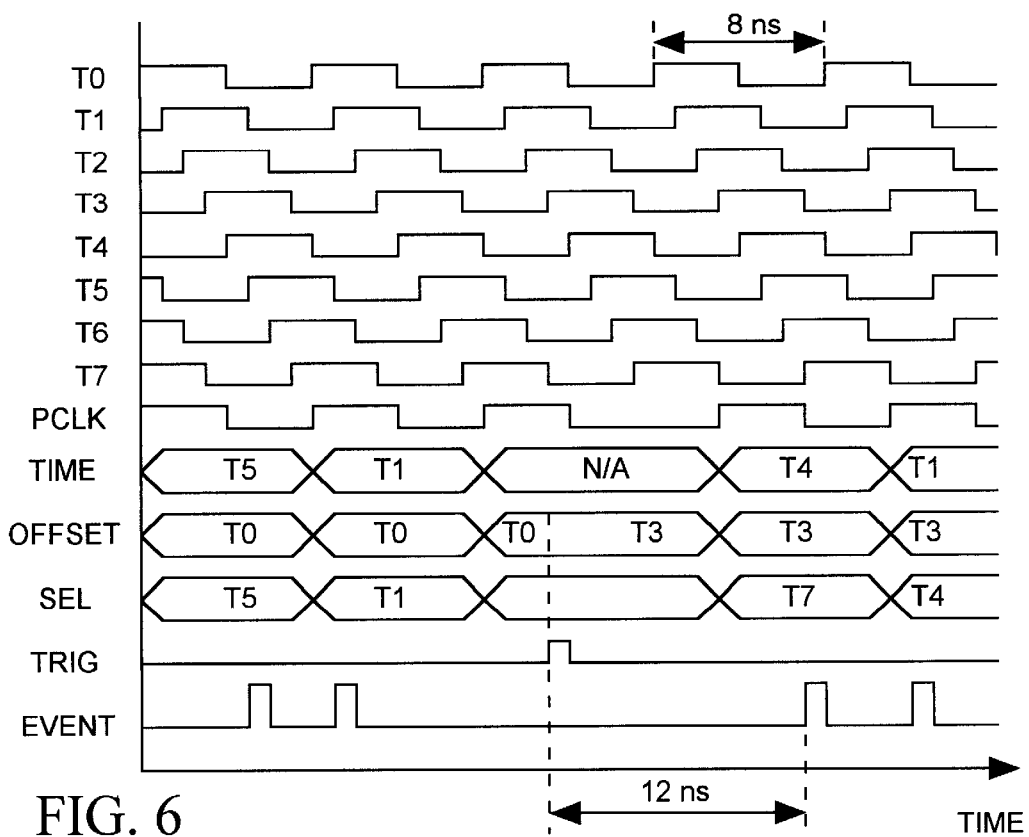
Figure 7:
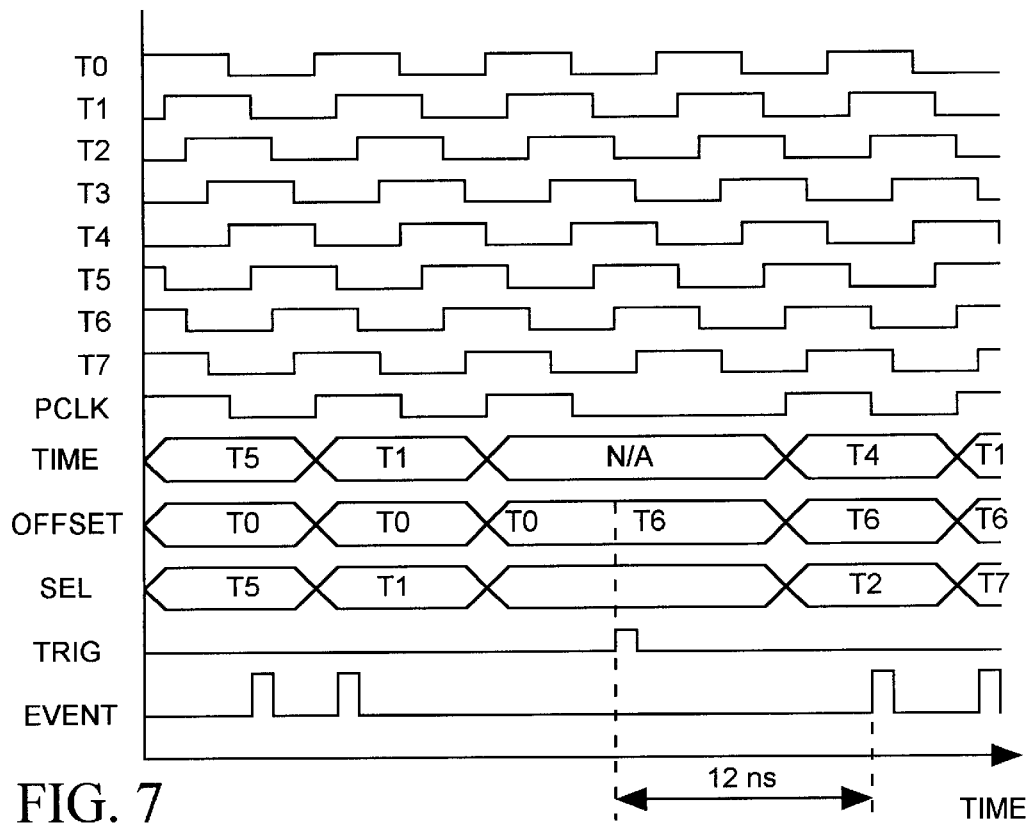
Figure 8:
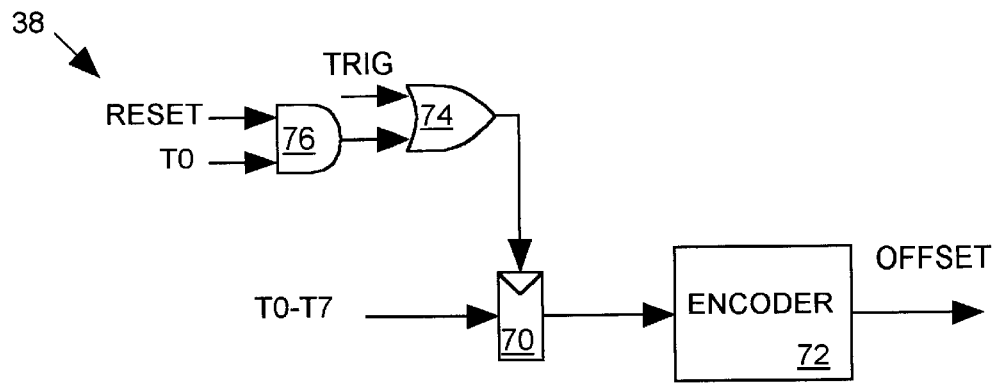
Figure 9:
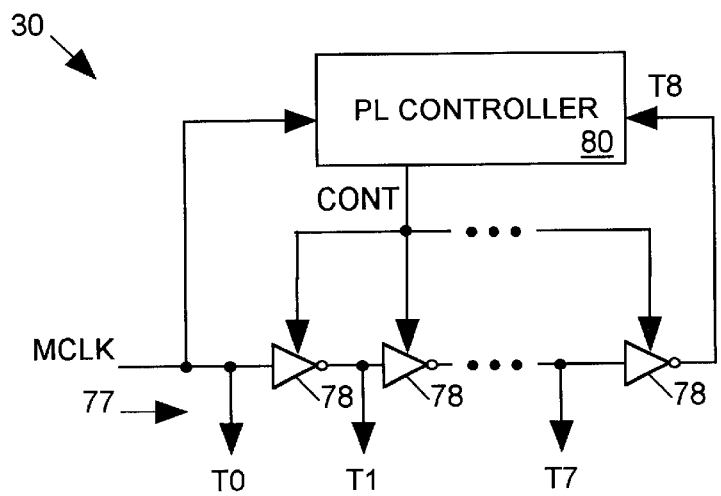
Figure 10:
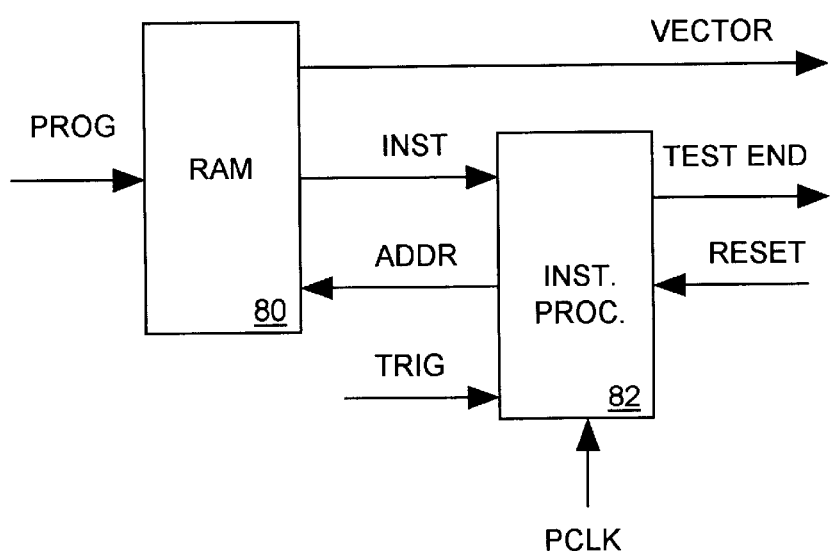

FIG. 1 illustrates an integrated circuit (IC) tester in accordance with the invention for testing an IC device under test (DUT), FIG. 2 illustrates a typical channel of the tester of FIG. 1 in block diagram form, FIG. 3 illustrates the drive circuit of the tester channel of FIG. 2 in more detailed block diagram form, FIG. 4 illustrates the compare circuit of the tester channel of FIG. 2 in more detailed block diagram form, FIG. 5 illustrates the timing event generator (TEG) circuit of FIG. 3 in more detailed block diagram form, FIGS. 6 and 7 are timing diagrams illustrating timing behavior of the TEG circuit of FIG. 5, FIG. 8 illustrates the time measurement unit (TMU) of the tester channel of FIG. 2 in more detailed block diagram form, FIG. 9 illustrates the timing signal generator of the tester channel of FIG. 2 in more detailed block diagram form, and FIG. 10 illustrates the pattern generator of the tester channel of FIG. 2 in more detailed block diagram form.

DESCRIPTION OF THE PREFERRED EMBODIMENT(S)

Tester Architecture

FIG. 1 illustrates a triggered integrated circuit (IC) tester 10 in accordance with the invention for testing an IC device under test (DUT) 12. Tester 10 includes a set of tester channels 14, each connected to a separate input/output (I/O) terminal of DUT 12, a host computer 16 linked to each tester channel 14 through a bus 18, and a clock signal generator 20 supplying a master reference clock signal MCLK to each channel 14 for synchronizing their test activities.

Tester 10 organizes an IC test into a succession of test cycles timed with reference to edges of the MCLK signal. During each test cycle each tester channel 14 may carry out one or more test events, including changing the state of a tri-state test signal input to DUT 12 or sampling a DUT output signal and determining whether it is of an expected state. Before the test, host computer 16 sends programming data to tester channels 14 via bus 18 defining the test activities each tester channel is to carry out during each test cycle. During a test, when any channel 14 detects that DUT 12 produces an output signal of an unexpected state, it transmits a FAIL signal as an interrupt to host computer 16 and to all other channels 14. All channels 14 then halt test operations.

In accordance with the invention, all channels 14 receive an externally generated trigger signal (TRIG). A TRIG signal edge may occur more than once and at any time during a test, and TRIG signal edges need not necessarily be synchronized to the MCLK signal. However each channel 14 responds to each TRIG signal edge by adjusting the timing of subsequent test events so that they occur with predictable delays following the TRIG signal edge.

Tester Channel Architecture

FIG. 2 illustrates a typical channel 14 of FIG. 1 in more detailed block diagram form. Channel 14 includes a tri-state driver 22 for supplying a TEST signal input to a terminal of DUT 12 of FIG. 1, and a drive circuit 24 for supplying DRIVE and ENABLE signal inputs to driver 22. The DRIVE signal controls whether the TEST signal is driven to a high or low logic level, and the ENABLE signal controls whether the TEST signal is tri-stated. Channel 14 also includes a compare circuit 26 for sampling any DUT output signal produced at the DUT terminal during each test cycle and determining whether it is of an expected state. Compare circuit 26 transmits the FAIL signal to host computer 16 and other tester channels 14 of FIG. 1 when the DUT output signal is of an unexpected state.

A pattern generator 28 supplies an input data word (VECTOR) to drive circuit 24 and compare circuit 26 before the start of each test cycle. Drive circuit 24 decodes each VECTOR to determine when to assert or de-assert the DRIVE and ENABLE signals during the test cycle. Compare circuit 26 decodes each VECTOR to determine when it is to sample the DUT output signal during the test cycle and also to determine the expected state of the DUT output signal. Before the start of a test, host computer 16 sends programming data (PROG) to each tester channel 14 of FIG. 1 via bus 18. A bus interface circuit 28 (FIG. 2) within the tester channel 14 forwards portions of that programming data (PROG) to drive circuit 24 and compare circuit 26 to tell them how to decode the VECTOR supplied before the start of each test cycle. Another portion of the programming data is supplied to pattern generator 28 in the form of an algorithm defining the VECTOR data sequence the pattern generator is to produce during the test.

Tester channel 14 also includes a timing signal generator 30 responding to the MCLK signal by generating a set of N (in this simplified example, eight) timing signals T0–T7, all having the same period as the MCLK signal but having differing phases. Edges of the T0–T7 signal evenly divide each MCLK signal cycle into eight segments, with the T0 signal being phase-locked to the MCLK signal. Drive circuit 24 and compare circuit 26 use timing signals T0–T7 as timing references when initiating state changes in the DRIVE and ENABLE signals or when sampling the DUT output signal during each test cycle.

During a test, a multiplexer 31 selects one of timing signals T0–T7 (initially T0) as input to an AND gate 32 that ANDS the selected timing signal with a RUN signal from a state machine 34 to produce a sequence of period clock (PCLK) signal edges. Each PCLK leading edge tells drive and compare circuits 24 and 26 and pattern generator 28 when a test cycle begins.

In accordance with the invention, a time measurement unit (TMU) 38 provided within each channel 14 monitors the TRIG signal and timing signals T0–T7. After being reset, TMU 38 generates output OFFSET data having a value of 0, thereby referencing timing signal T0. However whenever a TRIG signal edge thereafter occurs, TMU 38 sets the output data (OFFSET) to a value between 0 and 7 to indicate a time delay following a T0 signal edge in which the most recent TRIG signal occurred. As described in detail below, TMU 38 notes the particular one of timing signals T0–T7 having an edge immediately preceding the last TRIG signal edge and sets the OFFSET data to the value 0–7 referencing that particular one of timing signals T0–T7. Thus the OFFSET data indicates the time delay between the T0 signal edge and the TRIG signal edge with a with resolution of $P_{MCLK}/8$ where $P_{MCLK}$ is the period of the master clock signal MCLK (the nominal length of a test cycle) and wherein $P_{MCLK}/8$ is the phase spacing between timing signal T0–T7.

To initiate a test, host computer 16 sends a START signal currently to the state machine 34 within each tester channel 14 via bus 18 and bus interface 36. State machine 34 then resets TMU 38 and asserts the RUN signal input to AND gate 32 so that it begins generating a period clock (PCLK) signal edge in response to each T0 signal edge following assertion of the RUN SIGNAL. Each PCLK signal edge tells drive circuit 24 and compare circuit 26 to load the current VECTOR output of pattern generator 28 and tells the pattern generator 28 to generate the VECTOR for the next test cycle. When a TRIG signal edge occurs during any test cycle, TMU 38 updates the OFFSET value depending on the timing of the TRIG signal edge, thereby causing multiplexer 31 to select another one of timing signals T0–T7 to control the PCLK signal. This adjusts the start of each subsequent test cycle so that it starts with a delay of $P_{MCLK}$ relative to the timing of the TRIG signal edge. The OFFSET data, also tells drive and compare circuits 24 and 26 to delay the timing of test events specified by the VECTOR by its indicated delay time. As explained in more detail below, delaying timing of test events of a VECTOR by the OFFSET delay renders the delay of each test event following a TRIG signal edge a predictable function of the VECTOR data output of pattern generator 28.

When a test is complete, pattern generator 28 signals state machine 34. State machine 34 then deasserts the RUN signal to stop the period clock PCLK, resets pattern generator 28 and transmits an END message to host computer 16 of FIG. 1 via bus interface 36. An incoming FAIL signal will also cause state machine 34 to turn off the RUN signal, to reset pattern generator 28 and to deassert the RUN signal.

Drive Circuit

FIG. 3 illustrates drive circuit 24 of tester channel 14 FIG. 2 in more detailed block diagram form. Drive circuit 24 includes a programmable decoder 40, a set of four timing edge generators (TEGs) 42–47 and a pair of type RS flip-flops 46 and 47. The Q output of flip-flop 46 provides the DRIVE output of drive circuit 24 and the Q output of flip-flop 47 provides the drive circuit's ENABLE output. Each TEG 42–45 may generate an output signal edge at a time during any test cycle indicated by input data supplied by decoder 40. The outputs DH and DL of TEGs 42 and 43 control the set (S) and reset (R) inputs of flip-flop 45, and the outputs EH and EL of TEGs 44 and 46 control the set and reset inputs of flip-flop 46. Decoder 40 decodes the VECTOR output of pattern generator 28 (FIG. 2) to provide input data (SEL_DH, SEL_DL, SEL_EH and SEL_EL) to TEGs 42–45, A logical "0" to "1" transition in the DH, DL, EH or EL signals during a test cycle set or reset flip-flop 46 or 47. Before the start of a test, host computer 16 (FIG. 1) supplies programming data (PROG) to decoder 40 telling it how to decode each possible VECTOR data value.

Compare Circuit

FIG. 4 illustrates compare circuit 26 of tester channel 14 of FIG. 2 in more detailed block diagram form. Compare circuit 26 includes a programmable decoder 60 for decoding the VECTOR output of pattern generator 28 to produce a data value SEL provided as input to a timing event generator 62 similar to TEG 42 of FIG. 4. Decoder 60 also supplies EXPECT data as input to a register 64 clocked by the PCLK signal. The SEL data output of decoder 60 references one of the timing signal inputs T0–T7 to TEG 62. However a non-zero OFFSET value input to TEG 62 causes it to select another of timing signals T0–T7 as an output SAMPLE signal supplied to a conventional comparator 66. Register 64 clocks the EXPECT data onto an input of compare circuit 66 at the start of each test cycle. Comparator 66 compares the DUT output signal to a reference voltage (VREF) in response to a SAMPLE signal edge to determine the logic state of the DUT output signal and asserts the FAIL signal output of compare circuit 26 when the DUT output signal's logic state fails to match the state indicated by the EXPECT data.

Timing Edge Generator

FIG. 5 illustrates TEG 42 of the driver channel 24 of FIG. 3 in more detailed block diagram form. Drive circuit TEGs 43–45 of FIG. 3 and compare circuit TEG 62 of FIG. 4 are similar.

TEG 42 includes a programmable decoder 48 for decoding the SEL_DH data output of decoder 40 to produce TIME data indicating a delay following the start of the test cycle with which the DH signal is to be asserted by referencing one of timing signals T0–T7. Decoder 48 is programmed by programming data PROG from host computer 16 before the start of a test. A register 50 clocked by the PCLK signal clocks the TIME data output of decoder 48 onto an input of an adder 52 and clocks the OFFSET data output of TMU 38 of FIG. 2 onto an input of an adder 52 at the start of each test cycle. Adder 52 adds the TIME data to the OFFSET data to produce a control data input (SEL) to a multiplexer 54.

As mentioned above, timing signals T0–T7 have the same frequency as the PCLK signal but are evenly distributed in phase so that they transition from a logical "0" to a logical "1" at different times during each test cycle. When the SEL data indicates the DH signal is to set flip-flop 45 (FIG. 3) in response to an edge of one timing signals T0–T7 during the test cycle, multiplexer 54 selects that particular timing signal T0–T7 and applies it as an input to another multiplexer 46 which forwards the selected timing signal as TEG output signal DH. When the SEL_DH data indicates that the DH signal is not to set flip-flop 45 at any time during the test cycle, decoder 48 asserts an output "no-action" bit (NA) signaling multiplexer 46 via register 50 to select a hard-wired logical "0" input as the DH signal for that test cycle. Thus no edge occurs in the DH signal during the test cycle.

When TMU 38 of FIG. 2 is reset it initially sets the OFFSET data value to 0 prior to a TRIG signal edge. Thus the SEL_DH data input directly selects the timing signal T0–T7 that is to control the DH signal edge timing. However when a TRIG signal edge occurs at some time during a test cycle, TMU 38 of FIG. 2 will set the OFFSET data to a non-zero value if the TRIG signal edge occurs immediately following an edge of one of timing signals T1–T7. Therefore at the start of the next test cycle, the PCLK signal clocks the new OFFSET data value onto the input of adder 52. Adder 52 thereafter increments each successive TIME signal value by the amount of the OFFSET data.

For example if the TRIG signal edge occurred immediately after an edge of timing signal T3, then the OFFSET data tells adder 52 to increment the TIME value by 3. If the SEL_DH data had a value of 2 indicating that the VECTOR referenced timing signal T2, then multiplexer 54 would actually select timing signal T5. The SEL output of adder 52 is 3 bits wide since the SEL data need only select from among eight timing signals T0–T7. Adder 52 overflows when the sum of OFFSET and $SEL_{13}DH$ is greater than 8. Thus, for example, when OFFSET is 3 and the TIME data value is 6, the SEL data output of adder 52 overflows to 2, causing multiplexer 54 to select timing signal T2.

As indicated above, the OFFSET data supplied as input to multiplexer 31 of FIG. 2 to select one of timing signals T0–T7 to control the period clock signal PCLK that clocks the OFFSET, TIME and NA signals into register 50 (FIG. 5) at the start of each test cycle and to tell pattern generator 28 (FIG. 2) when to generate a vector for the next cycle.

Trigger Synchronization

FIG. 6 is a timing diagram illustrating timing relationships between various signals of TEG 42 of FIG. 5 during five successive test cycles. The nominal test cycle period $P_{PCLK}$ is 8 ns (nanoseconds) so that edges of the T0–T7 signals are spaced 1 ns apart. For the first test cycle, the TIME data derived from the VECTOR for that test cycle reference timing signal T5 while the OFFSET data references timing signal T0. The SEL data output of adder 52 therefore selects timing signal T5 (5+0) to trigger an event referenced by the vector. Since OFFSET selects T0, the PCLK edge occurs in response to a T0 edge. For the second test cycle, the TIME and OFFSET data respectively reference timing signals T1 and T0 and the SEL data output of adder 52 selects timing T1 (1+0) to trigger a second test event. For the third test cycle, the TIME data indicates that no test event (NA) is to occur. Since multiplexer 56 of FIG. 5 does not select the output of multiplexer 54, the SEL data value is not relevant.

Since a TRIG signal edge occurs during the third test cycle immediately following an edge of the T3 timing signal, the OFFSET data now begins to reference timing signal T3 instead of timing signal T0. The OFFSET data therefore changes the selection of multiplexer 31 of FIG. 2 so that the edge of PCLK signal initiating the fourth test cycle occurs in response to a T3 timing signal edge. During that fourth test cycle, which starts on a T5 timing signal edge, adder 52 adds a VECTOR-specified TIME data value T4 to the OFFSET T3 to produce SEL data referencing T7 (4+3), thus the VECTOR-specified event occurs during the fourth test cycle on an edge of the T7 signal. Note that this event occur 12 ns following the TRIG signal edge. That is equal to the sum of the nominal length (8 ns) of one test cycle and the time delay (4 ns) between T0 and T4 indicated by the VECTOR-specified TIME data.

FIG. 7 is a timing diagram similar to FIG. 6. However instead of occurring immediately after the edge of timing signal T3 as in FIG. 6, the TRIG signal edge occurs immediately after an edge of timing signal T6 in FIG. 7. The TIME data references timing signal T4. Thus during the fourth test cycle, the SEL data selects timing signal T2 since adder 52 overflows to 2 when trying to add 4+6. The event therefore occurs during the fourth test cycle on an edge of the T2 timing signal rather than on an edge of the T7 timing signal as in FIG. 6. However note the fourth test cycle event occurs with the same delay (12 ns) following the TRIG signal edge in either case.

Thus if we know that the TRIG signal is going to occur sometime during the third test cycle, and we know that the vector for the fourth test cycle references timing signal T4, then we can predict that the event specified by the vector will occur during the fourth test cycle (8+4=12) nanoseconds after the TRIG signal edge regardless of when during the third test cycle the TRIG signal edge occurs.

In general given a nominal test cycle period of $P_{PCLK}$, and given that a VECTOR specifies an event to occur concurrently with an edge of timing signal N during the Kth test cycle following the cycle in which a TRIG signal edge occurs, then we can predict that the event will actually occur $(K*P_{PCLK}+N)$ ns following the TRIG signal edge within the timing resolution provided by the timing signal edges. Thus all events during cycles following a TRIG signal edge occur with delays following that TRIG signal edge that are predictable functions of the timing data encoded into the VECTORs defining those events.

It should be noted that the period of the test cycle during which a TRIG edge occurs can be extended by a variable amount of time beyond the nominal period of one test cycle. For example as illustrated in FIGS. 6 and 7, the third test cycle was extended to 11 ns and 14 ns respectively. In the examples illustrated by FIGS. 6 and 7, the VECTOR for the third test cycle indicated that no test event was to occur during that test cycle. However suppose that VECTOR had indicted that an event was to occur during the third test cycle and had referenced, for example, timing signal T2. Then the event would have occurred during the third test cycle in response to the edge to the T2 timing signal. Since, as illustrated in FIG. 6, the TRIG signal edge extended the third test cycle and set the OFFSET equal to 3, the event would have occurred for a second time during the third test cycle in response to the edge of timing signal T5. Thus if the vector for a test cycle in which a TRIG edge is to occur specifies an event, it should restricted to an event that will not have an adverse effect on the test if, due to the test cycle extending, the event happens to occur twice during that test cycle.

State machine 34, may be programmed by programming data (PROG) from host computer 16 to respond to the TRIG signal or to ignore it. For example, it may be programmed to assert the RUN signal after receiving the START signal, only upon receiving the TRIG signal. In such case the test will begin in response to the TRIG signal, with all test events being timed relative to that TRIG signal edge. State machine 34 may also be programmed to toggle the RUN signal on and off in response to successive edges of the TRIG signal, thereby providing a means for temporarily halting and restarting a test in a manner synchronized to the TRIG signal.

Time Measurement Unit

FIG. 8 illustrates a suitable embodiment of TMU 38 of tester channel 14 of FIG. 2 in more detailed block diagram form. A regenerative latch 70 latches the T0–T7 signals onto the input of an encoder 72 in response to an edge of the TRIG signal applied to the control input of latch 70 via an OR gate 74. Latch 70 resolves the state of any timing signal T0–T7 that may currently be in transition at the moment the latch is triggered. Encoder 72 encodes the output of latch 70 to produce OFFSET output data of value referencing the most recent timing signal T0–T7 to be asserted. An AND gate 76 ands the RESET and the T0 signal to provide a second input to OR gate 74. When state machine 34 of FIG. 2 asserts the RESET signal, the next T0 signal edge operates latch 70. The latched values of T0–T7 then cause encoder 72 to zero the OFFSET value.

Timing Signal Generator

FIG. 9 illustrates timing signal generator 30 of tester channel 14 FIG. 2 in more detailed block diagram form. Timing signal generator 30 includes a tapped delay circuit 77 formed by a set of series-connected logic gates such as inverters 78, with each inverter 78 producing a separate one of the T1–T7 timing signals. The first inverter 78 of the series receives the master clock signal MCLK as input and the last inverter 78 produces a T8 signal as output. The MCLK signal is also provided as the T0 timing signal output of timing signal generator 30. All inverters 78 are similar, having a similar delay determined by delay control signal (CONT) supplied as input thereto. The CONT signal may be either a power supply or bias input to the inverters 78 and controls their switching speed. The T0 and T8 signals provide inputs to a phase lock controller 80 which adjusts the CONT signal magnitude so the timing signal T8 is phase locked to timing signal To. This ensures that timing signals T0–T7 are evenly distributed in phase such that their edges divide the period of the T0 signal into eight equal segments.

Pattern Generator

FIG. 10 illustrates pattern generator 28 of tester channel 14 of FIG. 2 in more detailed block diagram form. Pattern generator 28 includes a random access memory (RAM) 80 and a conventional instruction processor 82. Host computer 16 writes an algorithmic program into RAM 80 including a VECTOR and an instruction (INST) at each address. In response to a first PCLK signal edge after being reset by a RESET signal from state machine 34 (FIG. 2), instruction processor 82 addresses the first address of RAM 80. RAM 80 then reads out the VECTOR and instruction stored at that address. The VECTOR is supplied to drive and compare circuits 24 and 26 (FIG. 2) and instruction INST is supplied to instruction processor 82 to tell it how to generate a next address (ADDR) input to RAM 80 in response to a next PCLK edge. The instruction INST may tell instruction processor for example, to increment or repeat the current address a number of times, to start or stop an instruction loop, to call or return from a subroutine, or to terminate program execution and transmit a TEST_END signal to state machine 34 of FIG. 2.

The trigger signal TRIG provides an input to instruction processor 82 that the instruction processor consults when responding to conditional instructions. For example a conditional branch instruction tells instruction processor 82 to conditionally branch to a particular address when the TRIG signal is asserted and otherwise increment the current address. A conditional repeat instruction tells instruction processor 82 to increment to a next address when the TRIG signal is asserted and to otherwise repeat the current address unchanged for the next test cycle.

Asynchronous Testing

Suppose we want tester 10 of FIG. 1 to temporarily halt a test of DUT 12 and wait for a trigger signal from external test equipment before resuming the test. We therefore apply the trigger signal as the TRIG signal input to each channel 14 of tester 10, and we program each channel 14 to execute a conditional repeat instruction whenever it is to wait for the TRIG signal. The conditional repeat instruction tells the instruction processor 82 of FIG. 10 to increment the instruction address (ADDR) only after a test cycle in which a TRIG signal edge occurs and to otherwise keep the ADDR value the same for the next test cycle. The VECTOR at the same address tells the tester channel to carry out no test activities during the test cycle. The next RAM 80 address stores a VECTOR for the first test cycle following resumption of the test. Thus the pattern generator 28 continues to produce a VECTOR telling the channel to do nothing until instruction processor 82 detects a TRIG signal edge. The tester then increments RAM 80 address ADDR so that pattern generator 20 produces a VECTOR for the next test cycle. TMU 38 adjusts the OFFSET data to account for the timing of the TRIG signal edge, so that subsequent test events occur with predictable delay following the TRIG signal edge.

Thus has been shown and described a preferred embodiment of an integrated circuit tester in accordance with the invention that adjusts timing of test events in response to an input trigger signal so that the test events occur with predetermined delays following the test event. While a preferred embodiment of the present invention have been shown and described, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus responsive to a trigger signal edge for carrying out a test activities at a terminal of an IC device under test (DUT) during a succession of test cycles, the IC tester comprising;

first means (20,30) for generating a first timing signal (T0) having periodic edges;

second means (38) receiving said first timing signal and said trigger signal edge for generating output offset data representing a first delay between an occurrence of one of said periodic edges and said trigger signal edge;

third means (28,32,34) for generating a sequence of vectors, each vector corresponding to a separate one of said test cycles, each vector indicating a test activity to be carried out during the corresponding test cycle, and each vector indicating a second delay; and fourth means (24,26) receiving said sequence of vectors and said offset data, for carrying out a test activity indicated by each vector of the sequence at a time during the corresponding test cycle that is a function of both the first delay indicated by the vector and the second delay indicated by said offset data.

2. The apparatus in accordance with claim 1 wherein said first means comprises:

fifth means (20) for generating a master clock signal having a fixed period; and sixth means (30) responsive to said master clock signal for generating a plurality of timing signals, including said first timing signal, each of said timing signals having said fixed period and each of said timing signals having a unique phase.

3. The apparatus in accordance with claim 2 wherein said fourth means receives said plurality of timing signals and responds to each vector during its corresponding test cycle by selecting one of said plurality of timing signals in accordance with said function and carrying out the test activity indicated by the received vector in response to an edge of the selected one of said plurality of timing signals.

4. The apparatus in accordance with claim 2 wherein said sixth means comprises:

a tapped delay circuit (77) for receiving the master clock signal and for generating said timing signals with phases controlled by an input control signal, and seventh means (80) receiving the master clock signal and one of said timing signal for adjusting said control signal so that the received timing signal is phase locked to said master clock signal.

5. The apparatus in accordance with claim 1 wherein said third means comprises:

fifth means (31,32,34) for generating a periodic clock signal (PCLK) having edges marking a start of each said test cycle; and sixth means (28) for generating a vector in response to each edge of said period clock.

6. The apparatus in accordance with claim 5 wherein said fifth means one of starts and stops its generation of edges of said period clock in response to said trigger signal.

7. The apparatus in accordance with claim 6 wherein said sixth means comprises a pattern generator for executing an algorithmic program defining said sequence of vectors.

8. The apparatus in accordance with claim 7 wherein said pattern generator alters a course of execution of said program in response to said trigger signal.

9. The apparatus in accordance with claim 8 wherein said pattern generator performs a conditional branch in said algorithmic program in response to said trigger signal.

10. The apparatus in accordance with claim 8 wherein said pattern generator calls a subroutine of said algorithmic program in response to said trigger signal.

11. An apparatus responsive to a trigger signal edge for carrying out a sequence of test activities at a terminal of an IC device under test (DUT) during a succession of test cycles, the IC tester comprising;

first means (30) for generating a plurality of timing signals having periodic edges of similar frequency but of differing phase;

second means (38) for generating offset data referencing one of said trigger signals having an edge occurring proximate in time to said trigger signal edge;

third means (28,32,34) for generating a sequence of vectors, each vector corresponding to a separate one of said test cycles, each vector indicating a test activity to be carried out during the corresponding test cycle, and each vector including timing data referencing one of said plurality of timing signals; and fourth means (24) for responding to each vector by selecting one of said plurality of timing signals in response a combination of said timing data included in the vector and said offset data, and for carrying out the test activity indicated by the vector in response to an edge of said one of said plurality of timing signals occurring during the test cycle corresponding to the vector.

12. The apparatus in accordance with claim 11 wherein said first means comprises:

fifth means for generating a master clock signal;

a tapped delay circuit (77) for successively delaying said master clock signal to generate said timing signals with delays controlled by an input control signal, and sixth means (80) receiving the master clock signal and one of said timing signal for adjusting said control signal so that said one of said timing signals is phase locked to said master clock signal.

13. The apparatus in accordance with claim 11 wherein said third means comprises:

fifth means (32,34) for generating a period clock signal having edges marking a start of each said test cycle; and sixth means (28) for generating a vector in response to each edge of said period clock.

14. The apparatus in accordance with claim 13 wherein said fifth means comprises:

seventh means for selecting one of said timing signals in response to said offset data, and eighth means for generating said period clock in response to said one of said timing signals selected by said seventh means.

15. The apparatus in accordance with claim 13 wherein said fifth means starts generating edges of said period clock in response to said trigger signal.

16. The apparatus in accordance with claim 13 wherein said sixth means comprises a pattern generator for executing an algorithmic program defining said sequence of vectors.

17. The apparatus in accordance with claim 16 wherein said pattern generator alters a course of execution of said program in response to said trigger signal.

18. The apparatus in accordance with claim 17 wherein said pattern generator performs a conditional branch in said algorithmic program in response to said trigger signal.

19. The apparatus in accordance with claim 17 wherein said pattern generator calls a subroutine of said algorithmic program in response to said trigger signal.

20. A method for testing an integrated circuit during a succession of test cycles following a trigger signal edge, the method comprising the steps of:

generating a plurality of timing signals having periodic edges of similar frequency but of differing phases;

responding to said trigger signal edge by generating offset data referencing a particular one of said timing signals having an edge occurring proximate in time to said trigger signal edge;

generating a vector corresponding to each test cycle, the vector referencing a test activity to be carried out during its corresponding test cycle and including timing data referencing one of said timing signals;

carrying out the test activity indicated by each generated vector during its corresponding test cycle in response to an edge of one of said timing signals selected in accordance with a combination of said timing data included in said vector and said offset data.

21. The method in accordance with claim 20 further comprising the step of starting each of said plurality of test cycles in response to an edge of the timing signal referenced by said offset data.

* * * * *